US008610823B2

(12) United States Patent
Rossi et al.

(10) Patent No.: US 8,610,823 B2
(45) Date of Patent: Dec. 17, 2013

(54) OPTICAL MODULE FOR A CAMERA DEVICE, BAFFLE SUBSTRATE, WAFER SCALE PACKAGE, AND MANUFACTURING METHODS THEREFOR

(75) Inventors: Markus Rossi, Jona (CH); Hartmut Rudmann, Jona (CH); Ville Kettunen, Ruschlikon (CH)

(73) Assignee: Heptagon Micro Optics Pte. Ltd., Singapore (SG)

( * ) Notice: Subject to any disclaimer, the term of this patent is extended or adjusted under 35 U.S.C. 154(b) by 533 days.

(21) Appl. No.: 12/809,390

(22) PCT Filed: Dec. 16, 2008

(86) PCT No.: PCT/CH2008/000531
§ 371 (c)(1),
(2), (4) Date: Oct. 25, 2010

(87) PCT Pub. No.: WO2009/076787
PCT Pub. Date: Jun. 25, 2009

(65) Prior Publication Data
US 2011/0032409 A1 Feb. 10, 2011

Related U.S. Application Data

(60) Provisional application No. 61/014,805, filed on Dec. 19, 2007.

(51) Int. Cl.
*H04N 5/225* (2006.01)
(52) U.S. Cl.
USPC ............................................. 348/374
(58) Field of Classification Search
USPC ............................ 348/373, 374, 335
See application file for complete search history.

(56) References Cited

U.S. PATENT DOCUMENTS

| 4,057,837 | A | * | 11/1977 | Needs et al. | 348/373 |
| 5,400,072 | A | * | 3/1995 | Izumi et al. | 348/335 |
| 5,673,083 | A | * | 9/1997 | Izumi et al. | 348/340 |
| 6,900,843 | B1 | * | 5/2005 | Uchiyama | 348/374 |
| 7,863,702 | B2 | * | 1/2011 | Seo et al. | 257/432 |
| 8,274,599 | B2 | * | 9/2012 | Gustavsson et al. | 348/374 |
| 2006/0044450 | A1 | * | 3/2006 | Wolterink et al. | 348/340 |
| 2006/0181633 | A1 | * | 8/2006 | Seo | 348/340 |
| 2007/0126898 | A1 | * | 6/2007 | Feldman et al. | 348/294 |
| 2007/0126912 | A1 | * | 6/2007 | De Bruin et al. | 348/340 |
| 2008/0252774 | A1 | * | 10/2008 | Chen et al. | 348/374 |
| 2009/0021635 | A1 | * | 1/2009 | Cheng | 348/374 |

FOREIGN PATENT DOCUMENTS

| JP | 9-27606 | 1/1997 |
| WO | 2005/041561 | 5/2005 |

* cited by examiner

*Primary Examiner* — James Hannett
(74) *Attorney, Agent, or Firm* — Rankin, Hill & Clark LLP

(57) ABSTRACT

An optical module for a camera device, the camera device including an image capturing element arranged on a base substrate portion, and has a top lens element and optionally further lens elements for imaging an object on the image capturing element, and further a baffle defining a predetermined field of view of the image capturing element. The baffle includes a generally transparent baffle substrate portion having a front surface and a rear surface, a generally non-transparent first layer with a plurality of first openings on the front surface and a generally non-transparent second layer with a plurality of second openings on the rear surface. The top lens element is arranged on the front and/or the rear surface of the baffle substrate, which leads to a reduced number layers/substrates in the module and to a reduced number of reflections on material-air interfaces, for example. The baffle has an improved ability to suppress unwanted light and enables protection of the inner part of the device as well as manufacture on wafer scale.

59 Claims, 5 Drawing Sheets

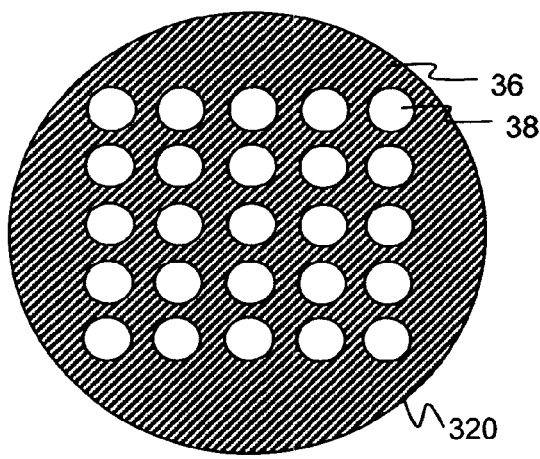
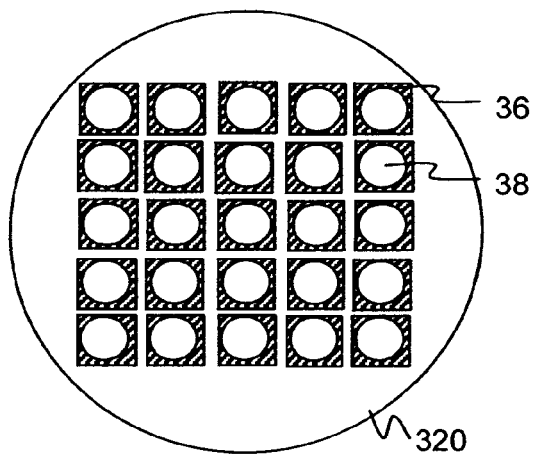
Fig. 9               Fig. 10
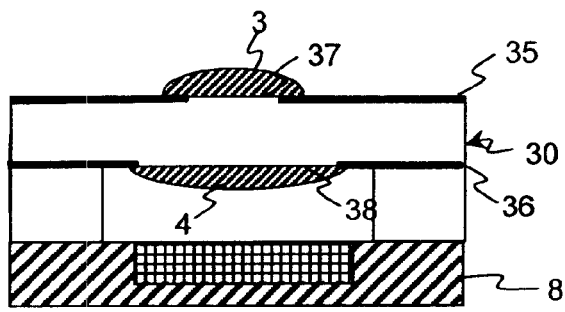
Fig. 11
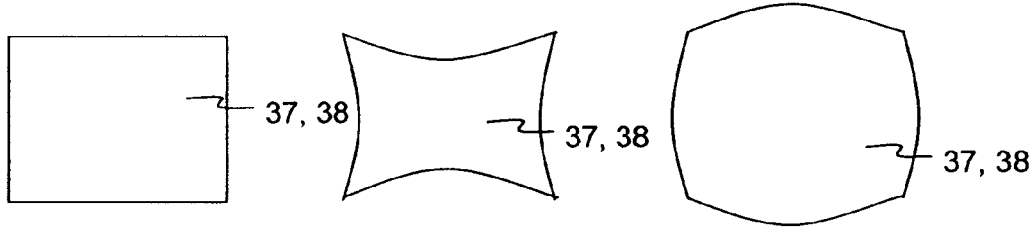
Fig. 12a        Fig. 12b        Fig. 12c

OPTICAL MODULE FOR A CAMERA DEVICE, BAFFLE SUBSTRATE, WAFER SCALE PACKAGE, AND MANUFACTURING METHODS THEREFOR

BACKGROUND OF THE INVENTION

1. Field of the Invention

The invention is in the field of integrated optical modules, in particular integrated camera devices with an image capturing element, such as a CCD sensor, and at least one lens element for imaging an object on the image capturing element, e.g. a refractive and/or diffractive lens. Integrated device means that all components are arranged in a well defined spatial relationship. Such integrated camera devices are, for example, cameras of mobile phones which are preferably manufactured in a mass production process at low cost.

More concretely, the invention relates to an optical module for a camera device comprising a baffle that defines a predetermined field of view (FOV) of the image capturing element, while suppressing beam paths coming from points outside this FOV. The invention further relates to a wafer scale package representing a plurality of such optical modules, to a baffle substrate with a plurality of baffles and to methods for manufacturing a plurality of optical modules for camera devices and for manufacturing a baffle substrate.

2. Description of Related Art

Especially in the field of mobile phones with cameras, but also for other applications, it is desirable to have a camera device that can be mass produced at low cost in an as simple process as possible and still has a good image quality. Such camera devices comprise an image capturing element and at least one lens element arranged along a common axis and are known from WO 2004/027880, for example. The known camera devices are manufactured on a wafer scale by replicating a plurality of lens elements on a disk-like substrate (wafer), stacking and connecting the substrates to form a wafer scale package (wafer stack) and dicing the stack in order to separate the individual camera devices from one another.

The camera devices are integrated optical modules, which include functional elements such as the image capturing element and the at least one lens stacked together along the general direction of light propagation. These elements are arranged in a predetermined spatial relationship with respect to one another (integrated device) such that further alignment with each other is not needed, leaving only the integrated device as such to be aligned with other systems.

Wafer-scale replication of lens elements allows the fabrication of several hundreds of generally identical devices with a single step, e.g. a single or double-sided UV-embossing process. Replication techniques include injection molding, roller hot embossing, flat-bed hot embossing, UV embossing. As an example, in the UV embossing process, the surface topology of a master structure is replicated into a thin film of a UV-curable replication material such as an UV curable epoxy resin on top of a substrate. The replicated surface topology can be a refractive or a diffractive optically effective structure, or a combination of both. For replicating, a replication tool bearing a plurality of replication sections that are a negative copy of the optical structures to be manufactured is prepared, e.g. from a master. The tool is then used to UV-emboss the epoxy resin. The master can be a lithographically fabricated structure in fused silica or silicon, a laser or e-beam written structure, a diamond turned structure or any other type of structure. The master may also be a submaster produced in a multi stage generation process by replication from a (super) master.

A substrate or wafer in the meaning used in this text is a disc or a rectangular plate or a plate of any other shape of any dimensionally stable, often transparent material. The diameter of a wafer disk is typically between 5 cm and 40 cm, for example between 10 cm and 31 cm. Often it is cylindrical with a diameter of either 2, 4, 6, 8 or 12 inches, one inch being about 2.54 cm. The wafer thickness is for example between 0.2 mm and 10 mm, typically between 0.4 mm and 6 mm.

If light needs to travel through the substrate, the substrate is at least partially transparent. Preferably, especially if CMOS sensors are present, at least one of the optical surfaces comprises a coating acting as an IR cutoff filter. Otherwise, the substrate can be nontransparent as well. In case of a camera device, at least one substrate bears electro-optical components, like the image capturing element, and may thus be a silicon or GaAs or other semiconductor based wafer; it may also be a CMOS wafer or a wafer carrying CCD arrays or an array of Position Sensitive Detectors.

Such integrated optical modules can be manufactured by stacking wafers along the axis corresponding to the direction of the smallest wafer dimension (axial direction). The wafers comprise functional elements, like lens elements or image capturing elements, in a well defined spatial arrangement on the wafer. By choosing this spatial arrangement in an adequate way, a wafer stack comprising a plurality of generally identical integrated optical modules can be formed, wherein the elements of the optical module have a well defined spatial relationship with respect to one another.

By spacers, e.g. a plurality of separated spacers or an interconnected spacer matrix as disclosed in US 2003/0010431 or WO 2004/027880, the wafers can be spaced from one another, and lens elements can also be arranged between the wafers on a wafer surface facing another wafer.

It is known to place a baffle in front of the top lens element of a camera device. A baffle is an element that defines a three-dimensional passage for light but is otherwise intransparent for light. In a camera device, a baffle serves to define a field of view (FOV) of the image capturing element and to suppress beam paths coming from points outside this FOV. Known baffles consist of a layer of non-transparent material having a given thickness in an axial direction and a through-hole for light transmission with normally varying cross sectional areas. In known baffles, the through-hole has the shape of a truncated cone with a given extent in the axial direction and given opening angle. The thickness as well as the angle of the side walls of the through hole determines the FOV and the critical angle (collection angle) under which incident light can pass the baffle and enter the camera device. It is often desired that the collection angle does not exceed a predetermined value. This is because light entering the device under higher angles is stray light and/or may not directly fall onto the photosensitive part of the image capturing element but may hit the photosensitive part only after one or more reflections inside the camera device. This may lead to artifacts in the image generated by the image capturing element, and, thus, to a reduced image quality.

Known baffles have thus a thickness of several 100 μm (e.g. 100-300 μm) and side walls of the through hole which are tapered with respect to the normal direction of the front wall baffle such that an opening with a varying cross section having a diameter in the range of 1-3 mm is formed. This, among other parameters of the sensor and optical system, restricts the full angle of the field of view to about 40 to 80°. A disadvantage of such baffles are reflections at the side walls of the through hole which also lead to artifacts in the image generated by the image capturing element, and thus to a reduced image quality. Reduction of the area of the side walls, however, is not possible, because this would lead to an increased collection of unwanted stray light.

Known baffles are normally injection molded parts. They are attached to the integrated camera device only after its complete manufacture, i.e. after the dicing step if a wafer scale manufacturing process is employed. This is not compatible with low cost wafer scale manufacture of the optical modules. The additional steps of attaching each individual baffle to each individual camera device associated therewith is time-consuming and complicated and thus another disadvantage of known modules and manufacturing processes.

A further disadvantage is that the optical system, or at least the top lens element, is fully accessible via the through hole. This may lead to damage and contamination.

WO 2005/041561 discloses a camera module and manufacturing method thereof, where a semiconductor housing comprises a solid-state image sensor and a lens element located above the solid-state sensor. The housing forms a shield against laterally scattered radiation, by having at least one plate of transparent material of which two sides are covered with a radiation-opaque layer which is provided with an aperture. The aperture in the layer, close to the sensor, has a smaller surface than the aperture in the layer located remote from the sensor. The lens element is formed in a transparent substrate which is sandwiched in between the image sensor and the plate with the apertures. This construction has the disadvantage that the number of optical interfaces (e.g. air/glass) is increased, leading to losses due to reflections at these faces.

BRIEF SUMMARY OF THE INVENTION

It is an object of the invention to provide an optical module for a camera device with improved image quality.

It is a further object of the invention to provide an optical module for a camera device that can be manufactured in a mass production process at low cost, and a corresponding manufacturing process.

It is a further object of the invention to provide a wafer scale package comprising a plurality of generally identical optical modules for camera devices.

It is a further object of the invention to provide a baffle substrate with a plurality of baffles and a corresponding manufacturing method.

The optical module for the camera device comprises a top lens element and optionally further lens elements for imaging an object on the image capturing element. It further comprises a baffle which defines a field of view of the image capturing element in the assembled camera device by geometrically determining a critical angle under which incident light can enter the camera device and eventually fall onto a photosensitive part of the image capturing element. An image capturing element arranged on a base substrate portion is present in the completed camera device. According to the invention, the baffle comprises a generally transparent baffle substrate portion having a front surface and a rear surface. It further comprises a generally optically non-transparent first layer on the front surface which has a first opening in an inner region of the front surface, and a generally optically non-transparent second layer on the rear surface which has a second opening in an inner region of the rear surface. This generally corresponds to two planar apertures that are arranged at a distance from one another, as seen in a direction normal to their planes, with the transparent substrate sandwiched in between the layers. The layers can be very thin (e.g. several hundred nm or few atom layers), because it only needs to have a thickness sufficient to achieve an optical density that is sufficient to completely or at least partially block light transmission through the layer. Light can then reach the image capturing element only by passing through the first opening and subsequently through the second opening. Among other parameters, the field of view is determined by the shape of the two openings, their axial distance and their lateral position with respect to one another.

The first and second openings are arranged at an axial distance from one another, said distance being defined by the thickness of the baffle substrate. This distance may correspond to the thickness of the non-transparent layer in conventional baffles, but may also be smaller. The shape of the openings may, for example, be circular, wherein the circles are preferably concentric. Preferably, the first opening has a larger diameter than the second opening.

The top lens element is arranged on the front or rear surface of the baffle substrate in the region of the first or second opening in the non-transparent layer.

In combination, the spaced apart first and second openings with the lens element directly attached to the baffle substrate portion form a passage for light that has generally the same effect as a conventional baffle with a through-hole and a lens spaced therefrom, but the following advantages:

Though the double layers with first and second openings have the same effect as a through hole with spaced front and rear surfaces, there are no physical side walls present. Consequently, there are no artifacts caused by reflection at such side walls. Light enters the camera device either without reflections, or not at all. Light rays that would hit the side walls of the through-hole in a conventional baffle here enter the transparent baffle substrate portion. They are trapped by total internal reflection and consequently suppressed.

As there is no through-hole, all lens elements arranged inside the camera device are fully protected from damage or contamination. In particular, the baffle substrate ensures scratch protection of the top lens, if it is arranged on the rear surface. It can also ensure protection of further optical elements, including lens elements and the image capturing element, from contamination and damage during the dicing step in a wafer scale manufacturing process.

The baffles can be manufactured on a wafer scale, e.g. by coating a transparent substrate (wafer) such that non-transparent layers are formed on both main surfaces, and by removing the coating in predetermined regions in order to form a plurality of first and second openings. This makes the attachment of the baffles fully compatible with a wafer scale manufacturing process of the camera device as such (without the baffle). It can be done without attaching individual baffles to individual integrated devices, and thus in a much more efficient way and at reduced cost.

Forming the through-hole in conventional baffles is mechanically complicated. According to the invention, no through-hole is needed. The openings in the first and second layers, which are much thinner than the conventional baffle, can be formed by known techniques, e.g. by photolithography, on a wafer scale. Thus, manufacture of the baffle as such is easier.

The baffle substrate serves as a substrate for the top lens. For example, the top lens may be arranged on the rear surface in close proximity of the second opening. As a consequence, the baffle substrate has a double function, and it can be done without a separate carrier substrate for the top lens. The whole module can thus be made thinner and with less components. Furthermore, the number of material interfaces (air-glass, air-plastic) within the module is reduced. Efforts for special treatment of the surfaces or other corrections in order to reduce reflections and to improve image quality can thus be reduced. If, as in a preferred embodiment, the front surface of the baffle substrate portion, is planar (with exception of the layer), all lens elements present are arranged in the interior of the module and thus protected from contamination and damage.

The baffle can be manufactured by applying one or more non-transparent layers to one or more transparent substrates. This has the advantage that arbitrary shapes of the opening and of the three dimensional passage for light can be realized. The shape of the opening can, for example, be adapted to the shape of the active sensor area to achieve a more homogenous light distribution on the sensor. For rectangular sensors it is advantageous to use openings that have a generally rectangular base wherein the side lines are curved in a concave or convex manner (cushion shape, barrel shape). Any surface of any substrate may serve as a carrier for a non-transparent layer, and also more than two layers, e.g. three or four, may be present with arbitrary shapes of the respective opening.

The top lens element is generally a convex semi-lens, wherein the lens is arched towards the image capturing element. It should be noted that, in conventional designs, the top lens element is always placed on top of a substrate, thus being arched towards the object to be imaged. In one embodiment of the invention, the top lens element of the invention is "reversed" with respect to such known designs. The invention enables a design where two lens elements are arranged on different substrates and face one another. Regarding the optical function, this generally corresponds to a classical double-sided lens or two lens elements on a common substrate. The "reverse" design, however, provides additional freedom of design, as parameters like the distance of the two curved surfaces are not limited by the thickness of the substrate, but can be freely chosen.

As the front surface of the baffle substrate portion is preferably planar, the baffle substrate can, over its entire area, rest against a support during replication of the top lens elements on its rear surface. The baffle substrate thus does not need to have the stability required for replication by itself; it can be made thinner than conventional substrates.

The invention further relates to a wafer scale package, comprising a baffle substrate a plurality of a top lens elements, optionally a base substrate with a plurality of image capturing elements, and optionally further lens elements for imaging an object on the image capturing elements. The generally transparent baffle substrate has a generally planar front surface and a generally planar rear surface, a generally non-transparent first layer with a plurality of second openings on the front surface and a generally non-transparent second layer with a plurality of second openings on the rear surface, wherein the first and second openings are shaped to define, among other parameters, a predetermined field of view of the image capturing element. The top lens elements are arranged on the front or rear surface of the baffle substrate. In addition to the advantages of the optical module or the camera device itself, the package has the advantage that individual devices/camera devices already comprising baffles can be manufactured in a mass production process from said wafer scale package by means of dicing.

The camera device as well as the package may also contain a spacer or a spacer layer, e.g. a spacer wafer or spacer plate with a plurality of openings or a plurality of individual spacers. The spacer or spacer layer ensures a well defined distance between the substrates and consequently between the baffle, the lens elements and the image capturing element. In a preferred embodiment, the lens elements are fully encapsulated by the substrates and the spacers, and are thus well protected.

The invention further relates to a method for manufacturing a plurality of optical modules for camera devices on a wafer scale, comprising the following steps:

1. Providing a generally transparent baffle substrate having a front surface and a rear surface, a generally non-transparent first layer with a plurality of first openings on the front surface and a generally non-transparent second layer with a plurality of second openings on the rear surface, and with a plurality of lens elements on the front or rear surface. The baffle substrate may be a glass wafer, or consist of any other transparent material. The non-transparent layers may be constituted by a thin film on the respective surfaces, e.g. formed by applying a non-transparent foil or a coating of suitable material and with suitable thickness (e.g. by PVC, sputtering, CVD, painting, spraying, immersing or other processes).
2. Optionally, also spacer layers and/or further lens elements arranged on further (intermediate) substrates are provided.
3. The substrates are then stacked and connected to one another in such a way that the top lens elements, and the first and second openings and optionally also the spacers and/or further lens elements are arranged in a predetermined spatial relationship. Usually, this step includes alignment of the elements present on the different substrates along common axes.
4. The package is then diced along predetermined planes, in order to separate the individual modules from one another.

Optionally, in case of wafer scale production of complete camera devices:

5. Providing a base substrate having a plurality of image capturing elements prior to or after dicing. The base substrate may be a silicon or GaAs or other semiconductor based wafer; it may also be a CMOS wafer or a wafer carrying CCD arrays or an array of Position Sensitive Detectors.

Preferably, the top lens elements are formed on the baffle substrate by means of a replication process. Preferably, at first, the first and second layers are formed by depositing a material on the surfaces. Then, openings are formed by selectively removing this material in certain regions, e.g. by photolithography and etching. Then, the top lens elements are replicated in the regions of the openings, preferably covering a slightly larger area than the second openings. The openings could also be formed by depositing material on selected regions of the front and rear surface, e.g. by protecting certain areas with a shield or an anti-adhesion coating.

The baffle substrate with the lens elements could also be manufactured in one piece, e.g. by injection molding or another replication process.

The invention further relates to a baffle substrate with a plurality of baffles, and to a corresponding manufacturing method. The baffle substrate comprises a generally transparent substrate having a front surface and a rear surface, a generally non-transparent first layer with a plurality of second openings on the front surface and a generally non-transparent second layer with a plurality of second openings on the rear surface, as well as a plurality of lens elements attached to the front or rear surface. It is manufactured by providing a generally transparent substrate having a front surface and a rear surface, e.g. a glass wafer; providing the front surface with a generally non-transparent first layer and providing the rear surface with a generally non-transparent second layer, e.g. by applying a thin film or coating, for example by means of PVD, sputtering, CVD or other material depositing processes; and providing the first layer with a plurality of first openings and providing the first layer with a plurality of second openings, preferably by photolithography.

One preferred application of the camera device is for CMOS cameras, including CMOS cameras for mobile phones. Here, the front surface of the baffle substrate, which can be flat and unstructured with the exception of the (thin) first layer, could be directly used as the cover window of the camera, of a module within the camera, or even of the phone cover instead of a separate cover window. This leads to both simplified assembly and lower material cost.

Among others, the invention has the advantages that the number of optical interfaces and losses in connection therewith can be reduced, smaller axial dimensions of the device can be achieved, unwanted light can be suppressed more efficiently, protection of functional elements of the module is ensured during manufacture and use, and the production process of the baffles as well as of the complete devices is fully compatible with a wafer scale manufacture, and can thus be realized in a mass production process at low costs.

BRIEF DESCRIPTION OF THE DRAWINGS

FIGS. 3-7, 11 show schematically camera devices according to the invention;

FIGS. 9 & 10 show baffle substrates;

FIG. 11 shows a camera device wherein the first openings as smaller than the second openings;

FIGS. 12a-c show examples for the shape of the first and second openings;

DESCRIPTION OF THE PREFERRED EMBODIMENTS

Figure 1:
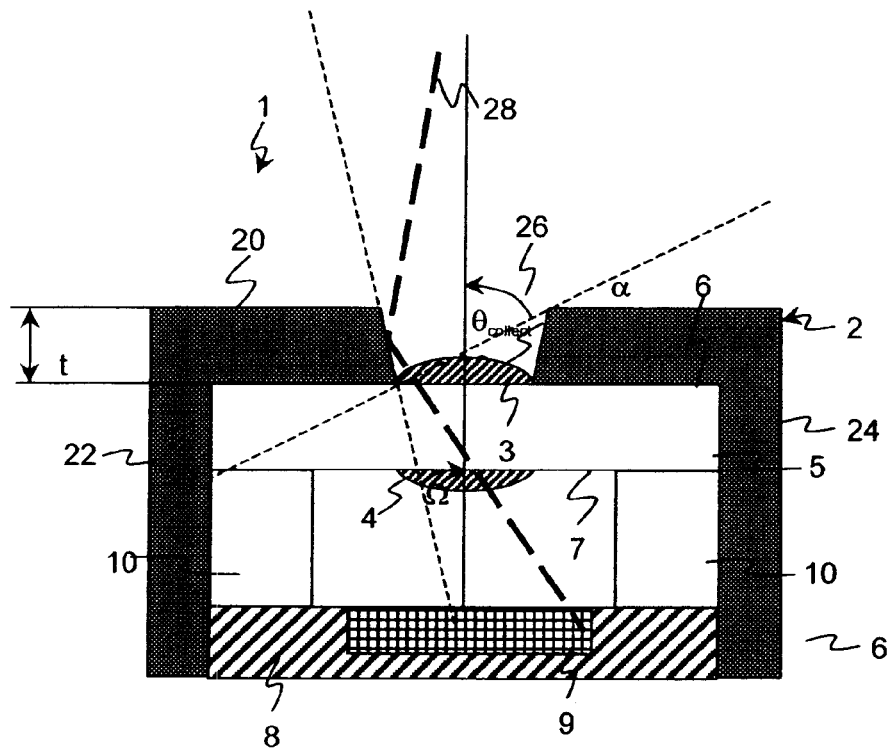
FIG. 1 shows schematically a camera device according to the prior art.

The camera device 1 according to the prior art comprises an optical system with one bi-convex lens, which is here constituted by two half-lenses 3, 4 arranged on a front surface 6 and a rear surface 7 of a lens substrate portion 5. The lens elements 3, 4 are replicated lens elements, for example. The camera device 1 further comprises a base substrate portion 8 with an image capturing element 9, e.g. a CMOS substrate with an image sensor. The lens substrate portion 5 and the base substrate portion 8 are stacked in an axial direction z (normal to their main surfaces) and are spaced from one another by means of spacers 10. Thereby, a well defined axial distance between the lens elements 3, 4 and the image capturing element 9 is realized. The modules consisting of the lens substrate portion 5, spacers and base substrate portion 8 are typically manufactured on wafer scale by means of providing a lens substrate having a plurality of lens elements 3, 4, providing a spacer layer, e.g. a spacer substrate having a plurality of through-holes, and providing a base substrate having a plurality of image capturing elements 9; then stacking and connecting these substrates, and subsequent dicing.

According to the prior art, these individual modules are provided with a baffle 2, only after the dicing step. A typical known baffle 2 is shown in FIG. 1. It comprises a front wall 20 running parallel to the substrate portions 5, 8 and side walls 22, 24 running perpendicular thereto. The baffle 2 encloses the module in the way of a housing. A typical thickness t of the front wall is 100-300 µm. The baffle 2 is typically made of plastic, e.g. in an injection molding process.

The front wall 20 of the baffle 2 has a through-hole 26 with a typically circular cross section which serves as an entry aperture for light. The viewing angle or field of view of the image capturing element 9 is defined by the distance of the through-hole 26 to the image capturing element 9, as well as the diameter of the through-hole 26. The side wall 26a of the through-hole 26 is tapered and defines a cone with an opening angle Ω. The front wall 20 with a thickness t of several 100 µm has the effect that light incident on the device or the front wall 20 under small angles of incidence α is prevented from entering the camera device 1 via the through-hole 26 (for an infinitesimal small thickness t, also light impinging under α≈0° would enter the module). Consequently, the baffle 2 defines a collection angle $\theta_{collect}$ for incident light. It is desired that $\theta_{collect}$ is smaller than 90°, because rays entering under a very small angle of incidence generally correspond to stray light and/or lead to reflections/straying within the module.

On the other hand, the non-infinitesimally small thickness t of the front wall 20 leads to artifacts in the image generated by the image capturing element 9. As shown in FIG. 1, there can be reflections/straying at the side wall 26a of the through hole 26. Such a reflected ray 28 is schematically shown in bold dashed lines. These reflections are an intrinsic problem of the prior art baffles.

Another problem is that the top lens element 3 is freely accessible through the through-hole 26. It can thus be contaminated or damaged during manufacture of the device or during use.

Figure 2:
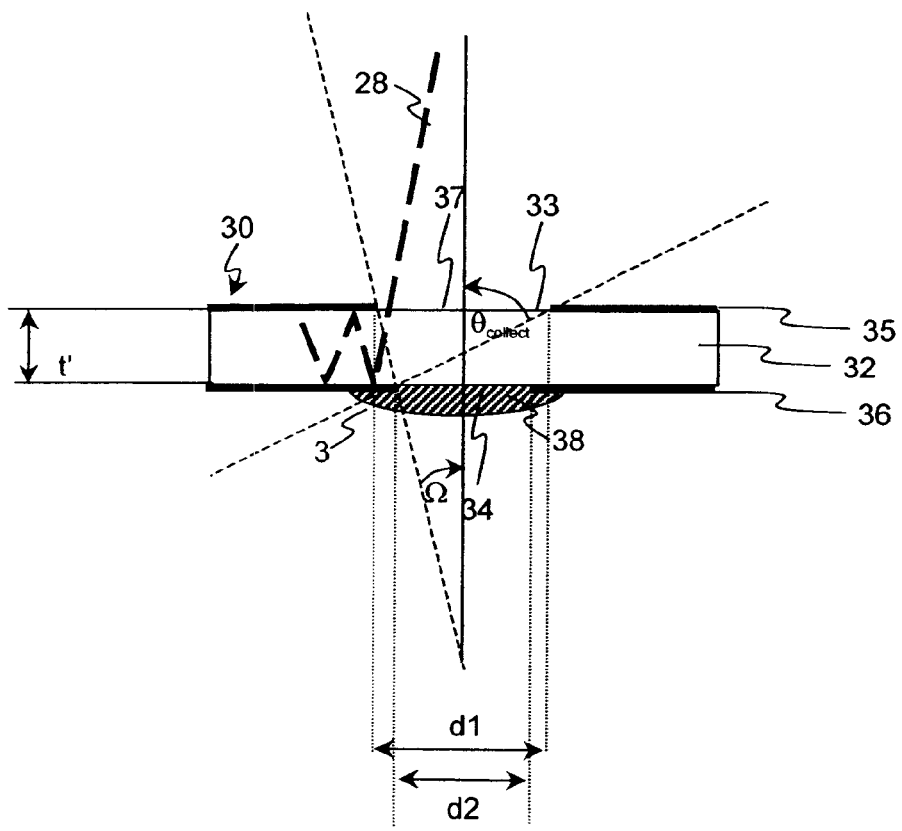
FIG. 2 shows schematically a baffle according to the invention.

FIG. 2 shows a baffle 30 according to the invention. The baffle 30 comprises a generally transparent baffle substrate portion 32, e.g. a portion of a glass wafer or any other generally planar piece of material, which is generally transparent in the optical range.

Figure 4:
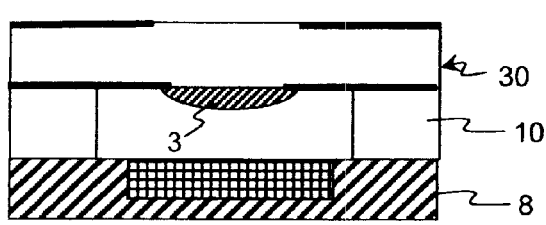
Figure 6:
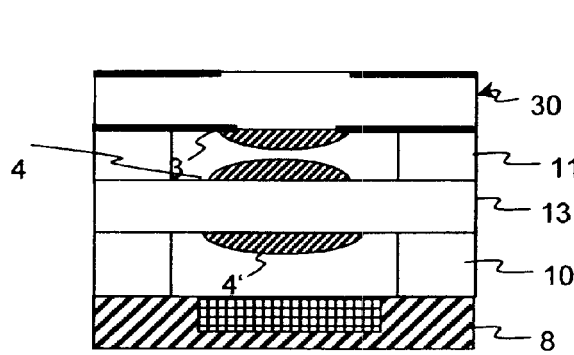

In this embodiment, the baffle substrate portion 32 has a generally planar front surface 33 and a generally planar rear surface 34, i.e. without a cut-out like the prior art through hole 26. The substrate portion 32 has a thickness t', e.g. in the range of 150-500 µm. As shown in FIG. 4 or 6, there could be a lens element attached to the rear surface 34. The baffle substrate portion could also be pre-shaped with, for example, integrated spacers.

Figure 3:
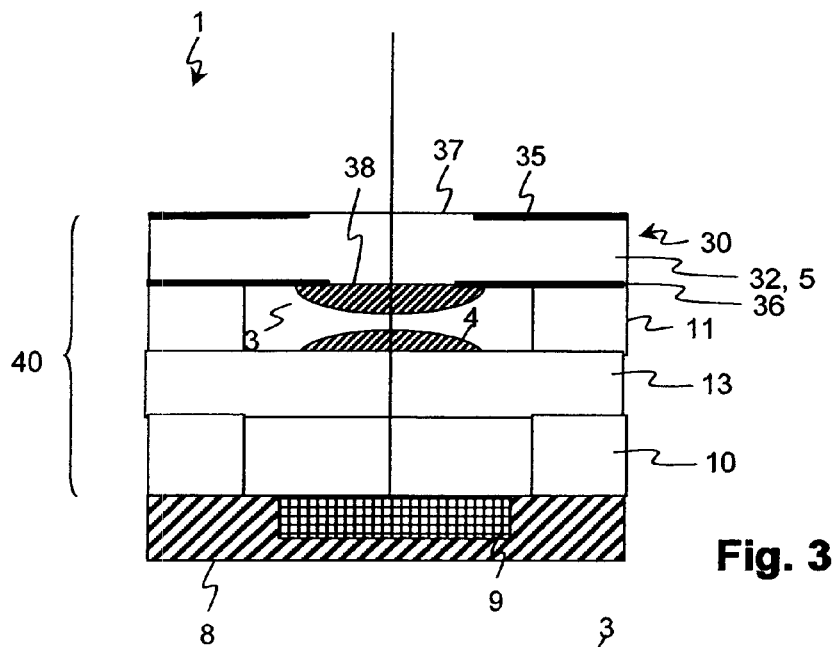

There is a first layer 35 of generally non-transparent material on the front surface 33 and a second layer 36 of generally non-transparent material on the rear surface 34. The layers 35, 36 cover the whole area of the respective surface 33, 34 with the exception of a first and second opening 37, 38 in a middle region thereof. The openings 37, 38 preferably have the shape of circles with diameters d1 and d2. They could have other shapes as well. In this example, the openings 37, 38 are arranged concentrically with respect to one another, as seen in an axial direction. The center of the openings 37, 38 preferably, but not necessarily corresponds to the optical axis of the completed module (as shown in FIG. 3). The diameter d1 of the first opening 37 is greater than the diameter d2 of the second opening 38. Both diameters range from 0.5 tot mm, for example.

This arrangement of the two spaced apart layers 35, 36 with their respective openings 37, 38 has generally the same effect as the baffle 2 of the prior art with its through-hole 26. In particular, the openings 37, 38 define the angles $\Omega$ and $\theta_{collect}$ as described above and thus enable definition of the field of view as well as suppression of light incident under small incidence angles. Light can enter the module via the openings 37, 38 and the transparent material of the baffle substrate portion 32.

The advantage of the invention is also illustrated in FIG. 2: A ray 28 corresponding to an incidence on the side wall 26a in FIG. 1 is shown in bold dashed lines. This ray 28 is not reflected, because there are no physical side walls. Instead, it enters the baffle substrate portion 32 and is reflected at the interface to the first and second layers 35, 36. Consequently, the light cannot pass the baffle 30.

Another advantage is that the baffle 30 according to the invention can act as cover window for the optical module because of the continuous, but in parts transparent baffle substrate.

The baffle 30 according to the invention has, by means of the two layers 35, 36 on both sides of a transparent substrate and the openings therein, an optically transparent, but mechanically impermeable window which has advanced performance compared to prior art baffles.

A lens element 3 is arranged on the rear surface 34 of the baffle substrate portion 32 in the region of the second opening 38. The lens element corresponds to the top lens element 3 in FIG. 1. It covers the complete area of the second opening 38, and is even wider, such that all light passing through the opening 38 is affected by the lens element 3. The second layer is, at least in the bordering regions of the opening 28, sandwiched between the material of the lens element 3 and the baffle substrate portion 32. The lens 3 could also be laterally smaller than the opening 38.

FIGS. 3-7 show camera devices 1 with a baffle 30 as shown in FIG. 2. These embodiments have the advantage that the baffle substrate portion 30 is used to support the lens needed to image an object onto the image capturing element. This is not possible with prior art devices. It can thus be done without a separate lens substrate or lens substrate portion, and the camera device can have a smaller extent in axial direction.

FIG. 3 shows a stack comprising the baffle 30 (acting as top lens substrate 5) as shown in FIG. 2, a further substrate portion 13 and two layers of spacers 10, 11 stacked in axial direction z and connected to one another to form an optical module 40. A camera device 1 is formed by connecting a base substrate portion 8 (or a complete base substrate prior to dicing) with an image capturing element 9 to the stack. The further substrate portion 5 comprises one lens elements 4 attached to its front surface. The top lens element 3 on the baffle substrate portion 32 and the upper lens element 4 on the further substrate portion 5 correspond to the two halves of the conventional lens 3, 4 in FIG. 1. The "reverse" arrangement of the lens elements with respect to FIG. 1 is illustrated.

The upper spacers 11 between the further substrate portion 13 and the baffle 30 serve for keeping the lens elements 3, 4 at an axial distance from one another. The lower spacers 10 between the top lens substrate portion 5 and the base substrate portion 8 serve for keeping the further substrate portion 13 at an axial distance from the front surface of the base substrate portion 8.

The baffle 30 limits the field of view of the image capturing element 9, reduces artifacts caused by rays incident through the first opening 37 in between the two layers 35, 36 and, as an additional effect, also serves as cover glass to protect the inside of the camera device 1 or the device 40, in particular the top lens element 3 from damage and contamination.

FIG. 4 shows a further example of the invention. The camera device 1 comprises a baffle with a baffle substrate portion 32 as shown in FIG. 2, a base substrate portion 8 with an image capturing element 9 and spacers 10 between these two substrate portions 32, 8. The top lens element 3 is directly attached to the rear surface 34 of the baffle substrate portion 32. The top lens element 3 covers partly or completely the second opening 38 in the second layer 36. It may be replicated directly on the baffle substrate, or otherwise attached thereto.

Figure 5:
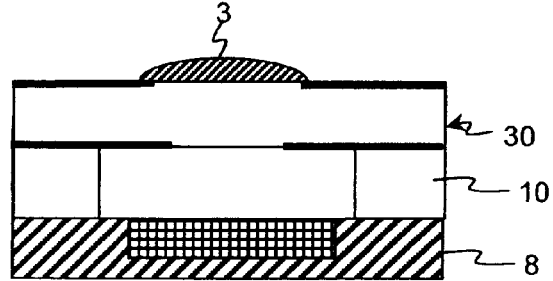

FIG. 5 shows a variant of the embodiment of FIG. 4, where the top lens element 3 is arranged on the front surface 33 of the baffle substrate portion 30, where it covers the first opening 37.

FIG. 6 shows a further embodiment of the invention. The camera device 1 comprises a baffle substrate portion 32 with the top lens 3 attached to its rear surface and a base substrate portion 8 with an image capturing element 9. It further comprises a further substrate portion 13 arranged between the baffle substrate portion 32 and the base substrate portion 8 and spaced with two layers of spacers 10, 11 therefrom. The further substrate portion 13 comprises two lens elements 4, 4' on both of its surfaces.

It is also possible that there is more than one single or double sided intermediate substrate portion.

Figure 7:
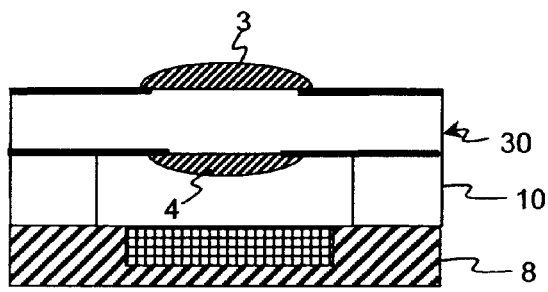

FIG. 7 corresponds to a combination of the embodiments of FIGS. 4 and 7: Lens elements 3, 4 are arranged on both surfaces 33, 34 of the baffle substrate portion 30.

Figure 8A:
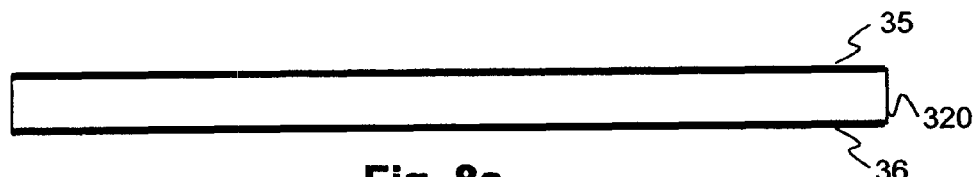
FIGS. 8a-d show schematically details of the manufacturing process.

FIGS. 8a-d show different steps of the process of manufacturing an optical module or camera device according to the invention on a wafer scale, e.g. a module as shown in FIG. 4. In FIG. 8a, an optically transparent substrate 320 is provided and coated on both main surfaces in order to produce a thin, optically non-transparent layer 35, 36. The coating material is preferably a mix of Chromium and Chromiumoxide, applied in a PVD process and having a total thickness in the range of some 100 nm (e.g. 500 nm), i.e. a few atom layers. This is generally sufficient to produce an optically dense structure that absorbs incoming light. The coating could as well be any other absorbing material, applied in a PVD, CVD, sputtering or other process. The coating could also be a thin plastic film or foil.

Figure 8B:
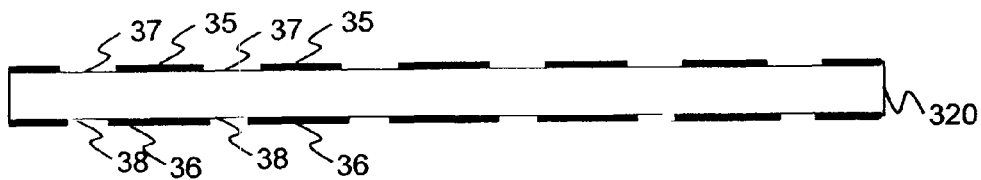

In the next step, which is shown in FIG. 8b, first openings 37 are produced in the first layer 35, and second openings 38 in the second layer 36. Preferably, a photolithographic technique is used to form the openings 37, 38: A light-sensitive photoresist is applied to the respective layer and optically illuminated with a mask. A series of chemical treatments then engraves the exposure pattern into the material underneath the photoresist.

As an alternative, the openings 37, 38 can be produced at the same time as the layers 35, 36 by leaving certain areas blank. This could be achieved by covering these areas with a material to which the material of the layers 35, 36 does not adhere, such that it can be washed off.

Figure 8C:
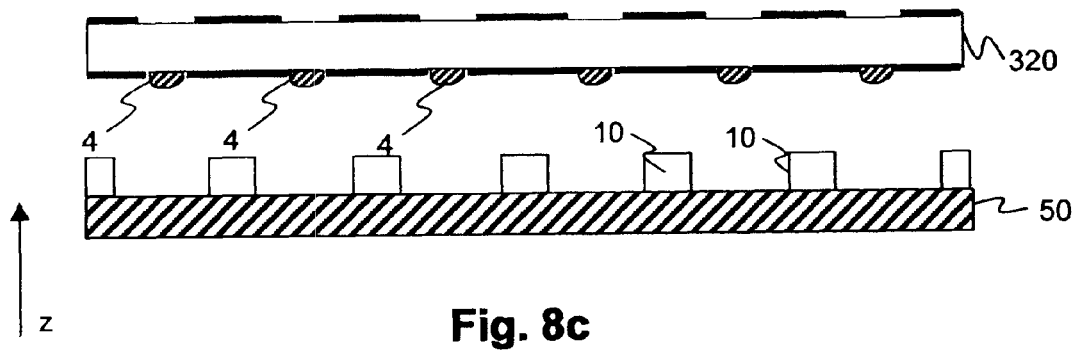
Figure 8D:
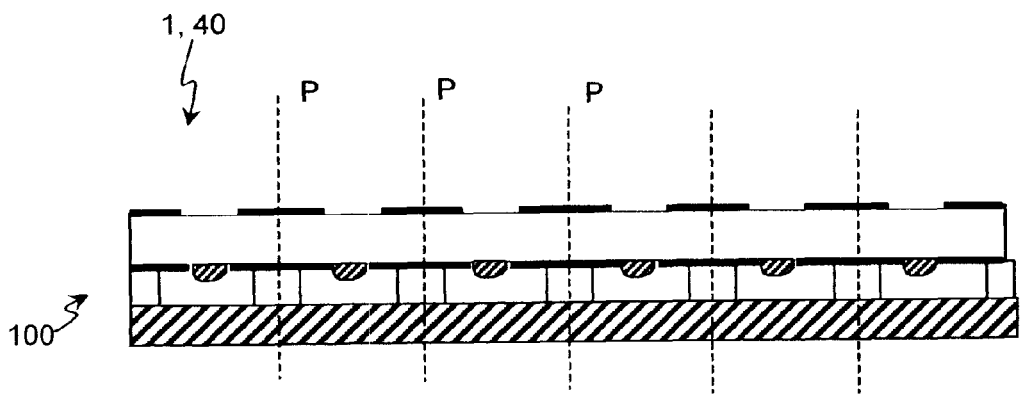

In the next step, which is shown in FIG. 8c, lens elements 3 are formed on the rear surface of the baffle substrate 320 in the regions of the second openings 38. They are preferably formed by means of a replication technique on wafer scale. For example, a replication tool having replication sections with a surface structure corresponding to the negative of the shape of the lens elements 3 is provided, and then aligned and brought into contact with the substrate 320 with a replication material between the replication sections and the rear surface of the substrate 320. The replication material is then hardened.

In addition, further lens elements could also be formed on an intermediate substrate (FIG. 3 or FIG. 6).

An additional substrate 50, which could be a substrate carrying a plurality of lens elements or a base substrate carrying a plurality of image capturing elements, is aligned with and brought into contact with the substrate 320. A layer of spacers 10, e.g. a spacer matrix, is arranged in between the substrates 320, 50. The spacers and substrates are then connected, e.g. by means of a UV-curable adhesive, in order to form a wafer stack 100 (wafer scale package).

Such a completed stack 100 is shown in FIG. 7d. Individual optical modules 40, or, in case of a base substrate with image capturing elements as additional substrate 50, camera devices 1 are formed by dicing the stack 100 along planes P running in an axial direction, preferably through the spacers 10.

FIGS. 9 and 10 show plan views of the baffle substrate 320, here by way of example of the rear surface. The substrate 320 comprises a circular plate. An optically intransparent layer 36 is formed thereon, here on the rear surface of the substrate 320. Openings 38 are formed in the layer by means of removing deposited material or by selectively depositing material only in the areas around the openings 38.

In FIG. 10, the layer 36 is formed only in regions around the openings 38, while leaving other areas uncovered. These free areas have improved surface properties, e.g. for bonding the spacer substrate to the baffle substrate by means of an UV curable adhesive.

FIG. 11 shows an embodiment of the invention where the first openings 37 in the first layer 35 on the front surface 33 are smaller than the second openings 38 in the second layer 36 on the rear surface 34. The effect is generally the same as illustrated in FIG. 2. Lens elements 3, 4 may be present on one or both surfaces 33, 34.

FIGS. 12a-c show examples for non-circular shapes of the first and second openings 37, 38. FIG. 12a shows a rectangular opening 37, 38. FIG. 12b shows a cushion shape, and FIG. 12c a barrel shape.

Generally, the contour of the opening preferably corresponds to the image of the active area of the sensor in the plane of the opening, as generated by the lens elements. The spot of light passing through the opening thus has the shape of the sensor, the sensor is illuminated homogeneously, and scattered light is reduced.

Figure 13A:
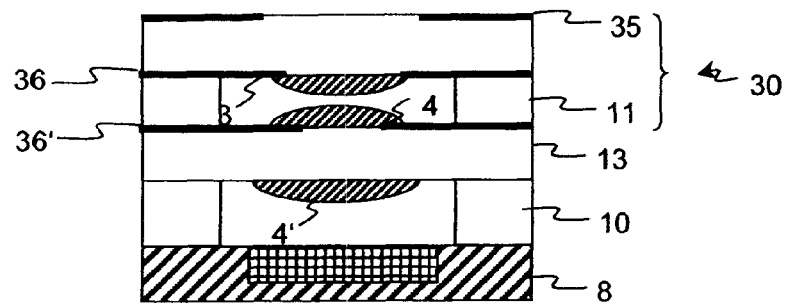
FIGS. 13a-c show further examples for camera devices with three or four non-transparent layers.
Figure 13B:
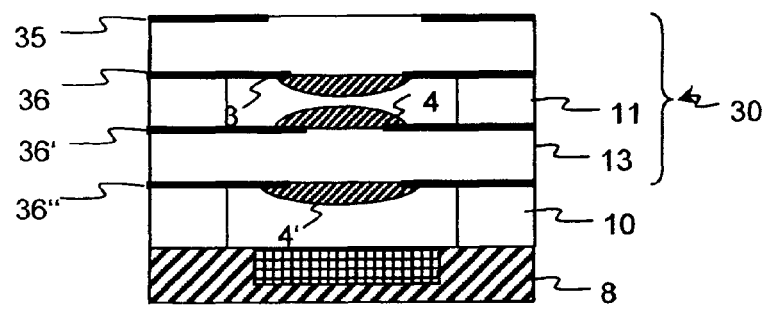
Figure 13C:
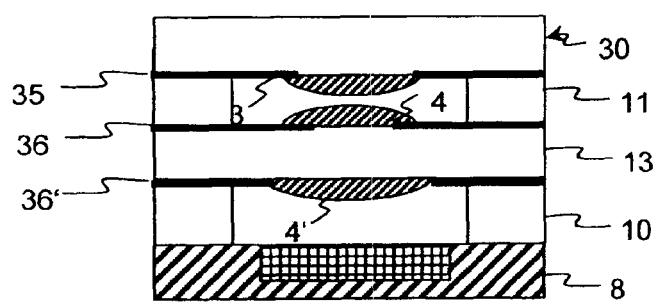

Baffles with the described non-circular shapes can also be used in connection with other optical modules or camera devices, e.g. as shown in the other figures. In particular, also conventional baffles (real holes in a substrate that has a certain thickness in direction of the optical axis) could be shaped like that. The contour preferably has 2-fold or 4-fold symmetry. Rectangular, cushion-like or barrel-like shapes are preferred in connection with rectangular sensors. FIGS. 13a-c show that the invention is not limited to the case where a baffle is defined by two intransparent layers. The three-dimensional passage for light can as well be defined by three or more layers 35, 36, 36', 36" with corresponding openings therein. The openings may have an arbitrary shape, e.g. circular or like in FIGS. 12a-c. The shapes are not necessarily the same. The diameters can increase or decrease in direction of light propagation, or can first decrease, then increase or vice versa. Preferably, lens elements are arranged also between the first and last layer, as seen in direction of light propagation.

The camera device of FIG. 13a has two substrates or substrate portions. It generally corresponds to the embodiment of FIG. 6 with the exception that there are three non-transparent layers 35, 36, 36', arranged on the top and rear surface of the first substrate and on the top surface of the second substrate.

The device of FIG. 13b corresponds to FIG. 13a, but has four non-transparent layers 35, 36, 36', 36" arranged on both surfaces of the two substrate portions.

In the embodiment of FIG. 13c, there are three non-transparent layers 35, 36, 36', 36", arranged on the surfaces of the two substrates, with the exception of the top surface of the first substrate. FIGS. 13a-c show the versatility of the invention and the ability to create almost any shape of the three dimensional passage. There could be even more substrates with corresponding non-transparent layers and with or without lens elements.

What is claimed is:

1. An optical module for a camera device, said camera device including an image capturing element arranged on a base substrate portion, the optical module comprising:

a top lens element and optionally further lens elements for imaging an object on an image capturing element, and further comprising a baffle defining a predetermined field of view of the image capturing element, wherein the baffle comprises a generally transparent baffle substrate portion having a front surface and a rear surface, a generally non-transparent first layer with a first opening on the front surface and a generally non-transparent second layer with a second opening on the rear surface, and wherein the top lens element is arranged directly on the rear surface of the baffle substrate portion in the region of the opening therein, wherein the baffle substrate portion is a carrier substrate for the top lens element, wherein the optical module further comprises at least one spacer between the baffle substrate portion and the base substrate portion, wherein said at least one spacer is not identical with said second layer, wherein the front surface of the baffle substrate portion is planar with the exception of the first layer, wherein all lens elements present are fully encapsulated by the substrate portions and the at least one spacer.

2. Optical module according to claim 1, wherein the cross sectional area of the first opening is larger than the cross sectional area of the second opening.

3. Optical module according to claim 1, wherein the cross sectional area of the first opening is smaller than the cross sectional area of the second opening.

4. Optical module according to claim 1, wherein the first and second openings have the shape of circles, which are arranged concentrically with respect to one another.

5. Optical module according to claim 1, wherein the top lens element covers an area of the rear surface that is larger than the cross sectional area of the second opening.

6. Optical module according to claim 1, wherein the second layer is, at least in a bordering region of the second opening, arranged in between the top lens element and the rear surface of the baffle substrate portion.

7. Optical module according to claim 1, wherein the top lens element is formed on the baffle substrate portion by means of a replication process, on wafer scale.

8. Optical module according to claim 1, further comprising at least one further lens element arranged on a generally transparent intermediate substrate portion.

9. Optical module according to claim 8, wherein the at least one further lens element is formed on the intermediate substrate portion by means of a replication process, on wafer scale.

10. Optical module according to claim 1, wherein the generally non-transparent first and second layers are constituted by a thin film or a coating on the baffle substrate portion.

11. Optical module according to claim 10, wherein the first and second openings are formed by selectively removing material deposited on the baffle substrate portion or by selectively depositing material on the baffle substrate portion.

12. Optical module according to claim 1, wherein an end face of the module is constituted by the front surface of the baffle substrate.

13. Camera device, comprising an optical module as claimed in claim 1, and an image capturing element arranged on a base substrate portion, said base substrate portion being directly or indirectly connected to the optical module.

14. Method for manufacturing a plurality of optical modules, comprising the following steps:
Providing a generally transparent baffle substrate having a front surface and a rear surface, a generally non-transparent first layer with a plurality of first openings on the front surface and a generally non-transparent second layer with a plurality of second openings on the rear surface;
attaching a plurality of top lens elements directly to the rear surface of the baffle substrate in the regions of the second openings, wherein the baffle substrate is a carrier substrate for the top lens elements;
providing at least one additional substrate, wherein the at least one additional substrate is or comprises at least one spacer, wherein said at least one spacer is not identical with said second layer;
stacking and connecting the substrates;
dicing the package formed in the step of stacking and connecting the substrates along predetermined planes, wherein the front surface of the baffle substrate is planar with exception of the first layer, and wherein all lens elements present are fully encapsulated by the substrates and the at least one spacer.

15. Method according to claim 14, wherein the step of providing a generally transparent baffle substrate comprises coating the front and rear surface of the baffle substrate with a material in order to form generally non-transparent layers of material, and forming the first and second openings by means of selectively removing the material.

16. Method according to claim 14, wherein the step of attaching a plurality of top lens elements comprises forming a plurality of top lens elements on the rear surface of the baffle substrate by means of a replication process.

17. Method according to claim 14, further comprising the step of providing a generally transparent further substrate having a plurality of further lens elements on at least one surface thereof, said lens elements being formed by means of a replication process.

18. Method according to claim 14, further comprising providing a base substrate having a plurality of image capturing elements, and stacking and connecting the substrates in such a way that the image capturing elements, the top lens elements, and the first and second openings are arranged in a well defined spatial relationship.

19. Camera device according to claim 13, wherein the contour of the first and/or second opening corresponds to an image of an active area of the image capturing element in the plane of the opening, as generated by the top lens element and optional further lens elements.

20. An optical module for a camera device, said camera device including an image capturing element arranged on a base substrate portion, the optical module comprising:
a top lens element and optionally further lens elements for imaging an object on an image capturing element, and
further comprising a baffle defining a predetermined field of view of the image capturing element, wherein the baffle comprises a generally transparent baffle substrate portion having a front surface and a rear surface, a generally non-transparent first layer with a first opening on the front surface and a generally non-transparent second layer with a second opening on the rear surface, and
wherein the top lens element is arranged on at least one of the front surface and the rear surface of the baffle substrate portion in the region of the opening therein, and
wherein the first or second layer is, at least in a bordering region of the first or second opening, arranged in between the top lens element and the front or rear surface of the baffle substrate portion.

21. Optical module according to claim 20, wherein the cross sectional area of the first opening is larger than the cross sectional area of the second opening.

22. Optical module according to claim 20, wherein the cross sectional area of the first opening is smaller than the cross sectional area of the second opening.

23. Optical module according to claim 20, wherein the first and second openings have the shape of circles, which are arranged concentrically with respect to one another.

24. Optical module according to claim 20, wherein the top lens element covers an area of the rear surface that is larger than the cross sectional area of the first or second opening.

25. Optical module according to claim 20, wherein the front surface of the baffle substrate portion is planar with the exception of the first layer, and does not contain lens elements.

26. Optical module according to claim 20, wherein the top lens element is formed on the baffle substrate portion by means of a replication process, on wafer scale.

27. Optical module according to claim 20, further comprising at least one further lens element arranged on a generally transparent intermediate substrate portion.

28. Optical module according to claim 27, wherein the at least one further lens element is formed on the intermediate substrate portion by means of a replication process, on wafer scale.

29. Optical module according to claim 20, wherein the generally non-transparent first and second layers are constituted by a thin film or a coating on the baffle substrate portion.

30. Optical module according to claim 29, wherein the first and second openings are formed by selectively removing material deposited on the baffle substrate portion or by selectively depositing material on the baffle substrate portion.

31. Optical module according to claim 20, wherein an end face of the module is constituted by the front surface of the baffle substrate.

32. Camera device, comprising an optical module as claimed in claim 20, and an image capturing element arranged on a base substrate portion, said base substrate portion being directly or indirectly connected to the optical module.

33. Baffle substrate with a plurality of baffles, comprising:
a generally transparent substrate having a front surface and a rear surface,
a generally non-transparent first layer with a plurality of second openings on the front surface and a generally non-transparent second layer with a plurality of second openings on the rear surface, and further comprising a plurality of lens elements arranged on at least one of the front surface and the rear surface of the baffle substrate portion in the region of the second openings,
wherein the first or second layer is, at least in a bordering region of the first or second opening, arranged in between the top lens element and the front or rear surface of the baffle substrate portion.

34. Baffle substrate according to claim 33, wherein the cross sectional area of the first openings is larger than the cross sectional area of the second openings.

35. Baffle substrate according to claim 33, wherein the cross sectional area of the first openings is smaller than the cross sectional area of the second openings.

36. Baffle substrate according to claim 33, wherein the first and second openings have a generally circular shape, and wherein the first and second openings are pairwise concentrically arranged.

37. Baffle substrate according to claim 33, wherein the generally non-transparent first and second layers are constituted by a thin film or a coating on the baffle substrate portion.

38. Baffle substrate according to claim 33, wherein the first and second openings are formed by selectively removing material deposited on the baffle substrate portion, or by selectively depositing material on the baffle substrate portion.

39. Baffle substrate according to claim 33, wherein the front surface of the baffle substrate is planar with the exception of the first layer, and does not contain lens elements.

40. Baffle substrate according to claim 33, wherein the lens elements are formed by means of a replication process, on wafer scale.

41. A wafer scale package, comprising a baffle substrate according to claim 33, and at least one additional substrate stacked in an axial direction, said additional substrate being at least one of an intermediate substrate supporting a plurality of further lens elements, a substrate supporting a plurality of image capturing elements, and a spacer layer.

42. Method for manufacturing a plurality of optical modules, comprising the following steps:
providing a generally transparent baffle substrate having a front surface and a rear surface, a generally non-transparent first layer with a plurality of first openings on the front surface and a generally non-transparent second layer with a plurality of second openings on the rear surface;
attaching a plurality of top lens elements to the at least one of the front surface and the rear surface of the baffle substrate in the regions of the first or second openings;
providing at least one additional substrate;
stacking and connecting the substrates;
dicing the package formed in the step of stacking and connecting the substrates along predetermined planes;
wherein the first or second layer is, at least in bordering regions of the first or second openings, arranged in between the top lens elements and the front or rear surface of the baffle substrate.

43. Method according to claim 42, wherein the step of providing a generally transparent baffle substrate comprises coating the front and rear surface of the baffle substrate with a material in order to form generally non-transparent layers of material, and forming the first and second openings by means of selectively removing the material.

44. Method according to claim 42, wherein the step of attaching a plurality of top lens elements comprises forming a plurality of top lens elements on at least one of the front surface and the rear surface of the baffle substrate by means of a replication process.

45. Method according to claim 42, further comprising the step of providing a generally transparent further substrate having a plurality of further lens elements on at least one surface thereof, said lens elements being formed by means of a replication process.

46. Method according to claim 42, further comprising providing a base substrate having a plurality of image capturing elements, and stacking and connecting the substrates in such a way that the image capturing elements, the top lens elements, and the first and second openings are arranged in a well defined spatial relationship.

47. Method according to claim 42, further comprising the step of providing a spacer substrate.

48. Method for manufacturing a baffle substrate with a plurality of baffles, comprising the steps of:
providing a generally transparent substrate having a front surface and a rear surface;
providing the front surface with a generally non-transparent first layer and providing the rear surface with a generally non-transparent second layer;
providing the first layer with a plurality of first openings and providing the first layer with a plurality of second openings;
attaching a plurality of top lens elements by forming a plurality of top lens elements on the at least one of the front surface and the rear surface of the baffle substrate;
wherein the first or second layer is, at least in a bordering region of the first or second openings, arranged in between the top lens elements and the front or rear surface of the baffle substrate portion.

49. Method according to claim 48, further comprising the step of forming the first and second openings by selectively removing material of the layers.

50. Camera device according to claim 32, wherein the contour of the first and/or second opening corresponds to an image of an active area of the image capturing element in the plane of the opening, as generated by the top lens element and optional further lens elements.

51. The optical module of claim 10, wherein said coating contains chromium and/or chromium oxide.

52. The optical module of claim 29, wherein said coating contains chromium and/or chromium oxide.

53. The optical module of claim 10, wherein said coating contains a thin plastic foil.

54. The optical module of claim 29, wherein said coating contains a thin plastic foil.

55. The optical module of claim 11, wherein the first and second opening are formed by selectively removing material deposited on the baffle substrate portion or by selectively depositing material on the baffle substrate portion by photolithography.

56. The optical module of claim 30, wherein the first and second opening are formed by selectively removing material deposited on the baffle substrate portion or by selectively depositing material on the baffle substrate portion by photolithography.

57. Baffle substrate according to claim 37, wherein said coating contains chromium and/or chromium oxide.

58. Baffle substrate according to claim 37, wherein said coating contains a thin plastic foil.

59. Baffle substrate according to claim 38, wherein the first and second openings are formed by selectively removing material deposited on the baffle substrate portion or by selectively depositing material on the baffle substrate portion by photolithography.

* * * * *